United States Patent
Tsukada et al.

(10) Patent No.: US 11,142,819 B2
(45) Date of Patent: Oct. 12, 2021

(54) SPUTTERING TARGET

(71) Applicant: SUMITOMO CHEMICAL COMPANY, LIMITED, Tokyo (JP)

(72) Inventors: Hiroyuki Tsukada, Tsukuba (JP); Masahiro Fujita, Niihama (JP); Koji Nishioka, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 198 days.

(21) Appl. No.: 16/332,183

(22) PCT Filed: Sep. 21, 2018

(86) PCT No.: PCT/JP2018/035011
§ 371 (c)(1),
(2) Date: Mar. 11, 2019

(87) PCT Pub. No.: WO2019/069714
PCT Pub. Date: Apr. 11, 2019

(65) Prior Publication Data
US 2020/0385853 A1   Dec. 10, 2020

(30) Foreign Application Priority Data

Oct. 2, 2017 (JP) .............................. JP2017-192895
Mar. 23, 2018 (JP) .............................. JP2018-056507

(51) Int. Cl.
*H01J 37/34* (2006.01)
*C23C 14/34* (2006.01)
*B24B 37/04* (2012.01)

(52) U.S. Cl.
CPC .......... *C23C 14/3414* (2013.01); *B24B 37/04* (2013.01); *H01J 37/3414* (2013.01); *H01J 37/3426* (2013.01); *H01J 37/3491* (2013.01)

(58) Field of Classification Search
None
See application file for complete search history.

(56) References Cited

U.S. PATENT DOCUMENTS

2009/0174987 A1* 7/2009 Mizuno ................ C23C 14/165
                                                      361/529
2018/0265412 A1* 9/2018 Nara ....................... C23C 14/08

FOREIGN PATENT DOCUMENTS

| CN | 106660881 A | 5/2017 |
| JP | 9-174394 A | 7/1997 |
| JP | 2000062333 A * | 2/2000 |
| JP | 2002-45663 A | 2/2002 |
| JP | 2011-127189 A | 6/2011 |
| JP | 2012-176452 A | 9/2012 |

(Continued)

OTHER PUBLICATIONS

Chinese Third Office Action, dated May 20, 2020, for Chinese Application No. 201880003494.5 with an machine English translation.

(Continued)

*Primary Examiner* — Jason Berman

(74) *Attorney, Agent, or Firm* — Birch, Stewart, Kolasch & Birch, LLP

(57) ABSTRACT

Provided is a sputtering target that is less likely to cause abnormal discharge. The sputtering target has a sputtering surface in which a lightness L in a Lab color system is more than 27 and 51 or less.

5 Claims, 1 Drawing Sheet

(56) References Cited

FOREIGN PATENT DOCUMENTS

JP            2014-218706 A     11/2014
JP            2017-2329 A       1/2017

OTHER PUBLICATIONS

Chinese Office Action for Chinese Application No. 201880003494.5, dated Aug. 30, 2019, with English translation.
Japanese Office Action for Japanese Application No. 2018-056507, dated May 29, 2018, with English translation.
Korean Office Action for Korean Application No. 10-2019-7007290, dated Aug. 1, 2019, with English translation.
Machine Translation of JP-2002-45663-A, published Feb. 12, 2002.
Machine Translation of JP-2011-127189-A, published Jun. 30, 2011.
Machine Translation of JP-2012-176452-A, published Sep. 13, 2012.
Machine Translation of JP-9-174394-A, published Jul. 8, 1997.
Taiwanese Office Action and Search Report for Taiwanese Application No. 107134106, dated Sep. 12, 2019, with English translation.
International Search Report issued in PCT/JP2018/035011 (PCT/ISA/210), dated Dec. 11, 2018.

* cited by examiner

SPUTTERING TARGET

TECHNICAL FIELD

The present invention relates to a sputtering target.

BACKGROUND ART

In recent years, sputtering has been used as a method of enabling uniform film deposition over a large area. The sputtering has become the mainstream of fabricating thin films constituting liquid crystal displays, organic EL displays, etc., as well as wiring films in the optical recording field and the semiconductor field, and the like. In the sputtering, a material processed into a shape such as flat plate, which is called a sputtering target, is used.

A problem associated with the sputtering is abnormal discharge caused during film deposition. The abnormal discharge tends to occur, especially when a high voltage is applied to the target in order to improve the deposition rate. Once abnormal discharge occurs, a target surface is molten and scattered, whereby scattered particles may adhere to a substrate in some cases. As a result, the product yield of sputtering targets would be reduced. In particular, when remarkably large abnormal discharge called hard arc occurs, an interlock for avoiding an excessive load on a device may operate, leading to a state in which a deposition process stops or a state in which the abnormal discharge continuously occurs after the occurrence of the hard arc.

In the related art, surface irregularities of a sputtering target have been taken into consideration as a parameter that contributes to the occurrence of abnormal discharge. For example, by setting surface irregularities of the sputtering target to a predetermined value, abnormal discharge is prevented, and thus the melting of the target surface is also prevented (see Patent Document 1). Specifically, when the surface roughness of a sputtering surface of a sputtering target is measured by a method specified in JIS B0601 (2001), the arithmetic average roughness Ra is 1.50 µm or less; the maximum height Rz is 10 µm or less; and an average value of a distance L from a P point, through a Q point appearing immediately after the P point, to another P point appearing immediately after the Q point is 0.4 mm or more on the assumption that the P and Q points correspond to points where peak heights measured from the center line in a roughness curve to the peak and valley of the curve, respectively, exceed a value of (0.5× Rz) when the P and Q points are sequentially counted over a reference length of 100 mm in the roughness curve. In this way, the melting of the target surface is prevented.

PRIOR ART DOCUMENT

Patent Document

Patent Document 1: JP 2011-127189 A

DISCLOSURE OF THE INVENTION

Problems to be Solved by the Invention

However, a conventional sputtering target cannot reduce hard arc sufficiently even if the sputtering target is manufactured in such a manner that the arithmetic average roughness Ra and the like associated with irregularities on the target surface fall within a predetermined range in order to effectively reduce abnormal discharge from the surface irregularities.

The present invention has been made to solve the foregoing problems, and it is an object of the present invention to provide a sputtering target which is less likely to cause abnormal discharge, particularly hard arc.

Means for Solving the Problems

In order to solve the above problems, the sputtering target of the present invention has a sputtering surface in which a lightness L in a Lab color system is more than 27 and 51 or less.

According to the sputtering target of the present invention, the sputtering can be performed while preventing abnormal discharge, even when a high voltage is applied to the target in order to improve a deposition rate.

In the sputtering target of one embodiment, a specular reflectance of the sputtering surface at a wavelength of 500 nm is 3.0% or less.

The sputtering target of the above-mentioned embodiment can appropriately leave any bumps that would trigger the sputtering, thereby making it possible to stably perform the sputtering when a high voltage is applied or in an initial stage of the sputtering.

In the sputtering target of another embodiment, a specular reflectance of the sputtering surface at a wavelength of 1,000 nm is 5.0% or less.

The sputtering target of the above-mentioned embodiment can appropriately leave any bumps that would trigger the sputtering, thereby making it possible to stably perform the sputtering when a high voltage is applied or in an initial stage of the sputtering.

In the sputtering target of another embodiment, the sputtering surface is a polished surface.

The sputtering target of the above-mentioned embodiment can be easily manufactured because the polished surface obtained by polishing can be used as the sputtering surface.

In the sputtering target of another embodiment, the target material is made of pure Al or an Al alloy.

In a metal having a low melting point, the occurrence of abnormal discharge tends to cause the "splash" in which the target material molten from the target surface is ejected out, and then particles of the target material having a size of several µm adhere to a substrate. Due to this, when forming a sputtering target from a material having a relatively low melting point, such as pure Al or an Al alloy, the occurrence of splash has been a concern. However, according to the present invention, even the sputtering target using pure Al or an Al alloy in the target material can effectively reduce the occurrence of splash.

Effects of the Invention

According to the present invention, the sputtering target that is less likely to cause abnormal discharge can be provided.

MODE FOR CARRYING OUT THE INVENTION

In view of the foregoing problems, the present inventors have searched for parameters, other than surface irregularities, that contribute to the occurrence of the abnormal discharge in a sputtering target, and as a result have newly found that there is a correlation between the lightness L in the Lab color system on the surface of the sputtering target and the occurrence of abnormal discharge. Furthermore, the present inventors also have searched for a range of lightness L in the Lab color system on the surface of the sputtering target that is less likely to cause abnormal discharge, and finally found that the occurrence of hard arc is reduced when the lightness L is in a range from more than 27 to 51 or less.

The reason why the sputtering target that is less likely to cause abnormal discharge is obtained by setting the lightness L to the above-mentioned value in the present invention is unknown in detail, but is thought to be influenced by the presence or absence of fine irregularities on the sputtering surface, which are not represented by the surface roughness, the shape of the irregularities, and the like. It is considered that by setting the lightness L on the sputtering surface of the sputtering target to 51 or less, abnormal discharge can be prevented from occurring due to irregularities on the sputtering surface, especially bumps. Furthermore, it is also considered that by setting the lightness L on the sputtering surface of the sputtering target to more than 27, fine irregularities are left on the sputtering surface, thereby making it possible to maintain discharge stability acquired at the start of sputtering.

The present invention will be described in detail below with reference to embodiments shown in the accompanying drawings.

Figure 1:
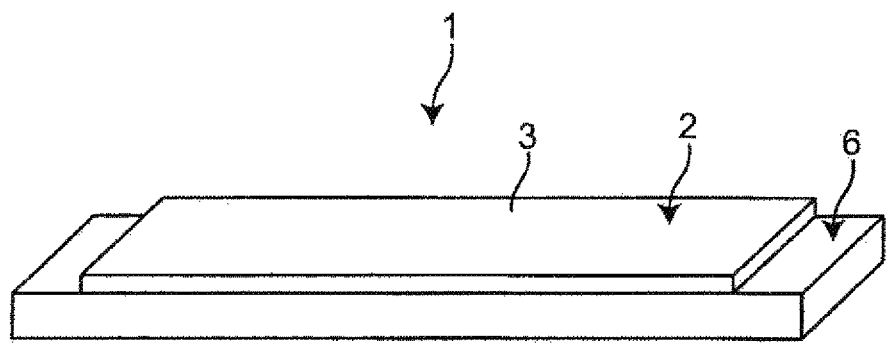
FIG. 1 is a perspective view from above of a sputtering target according to an embodiment of the present invention.
Figure 2A:
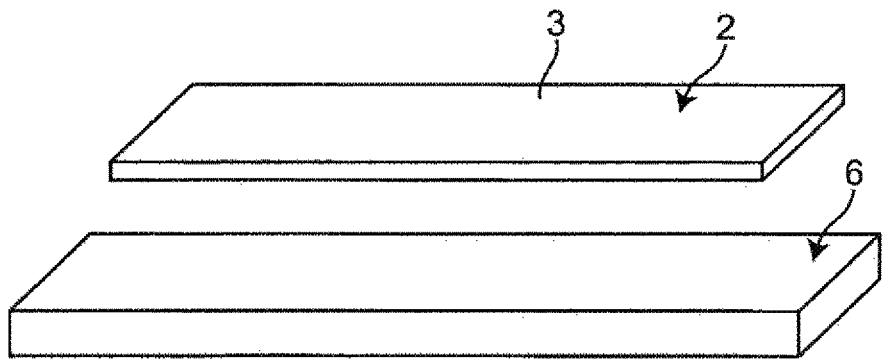
FIG. 2A is an explanatory diagram for explaining a method for manufacturing a sputtering target.
Figure 2B:
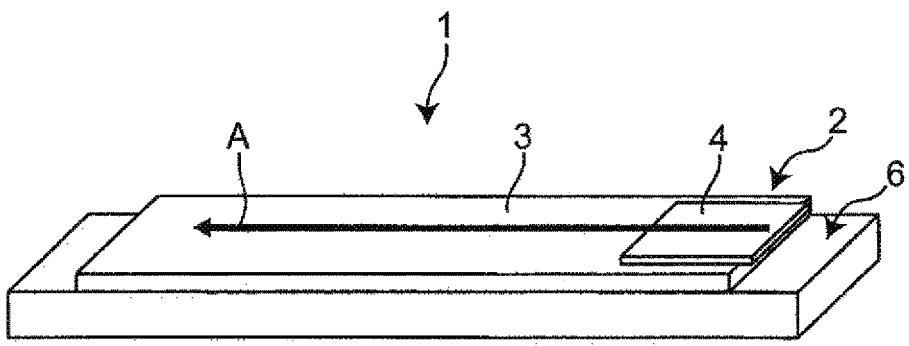
FIG. 2B is an explanatory diagram for explaining the method for manufacturing a sputtering target.

FIG. 1 is a perspective view from above of a sputtering target according to an embodiment of the present invention. FIGS. 2A and 2B are explanatory diagrams for explaining a method of manufacturing the sputtering target.

As shown in FIG. 1, a sputtering target 1 of an embodiment of the present invention includes a target material 2 and a backing plate 6 joined to a lower surface of the target material 2. The target material 2 is formed in an elongated plate shape. A sputtering surface 3 is constituted of an upper surface defined by a short side and a long side. The lightness L in the Lab color system of the sputtering surface 3 is more than 27 and 51 or less. The lightness L as used in the present invention may be an average value of the lightness L at a plurality of arbitrary points on the sputter surface 3 or may be a value of the lightness L at one arbitrary point. In particular, the minimum value of the lightness L on the entire sputter surface 3 is preferably more than 27 and the maximum value thereof is 51 or less. The minimum and maximum values thereof are more preferably 28 or more and 50 or less, respectively, still more preferably 32 or more and 48 or less, respectively, and particularly preferably 35 or more and 46 or less, respectively. The lightness L in the present invention is the lightness L in the Hunter color system, and indicates the lightness measured by a color difference meter, for example, Z-300A (trade name, manufactured by NIPPON DENSHOKU INDUSTRIES Co., Ltd.) or the like.

The shape and size of the target material 2 are not particularly limited, and thus the target material 2 having an arbitrary shape and size suitable for various applications can be used. As shown in FIG. 1, when the target material 2 is formed in a plate shape, including the rectangular sputter surface 3, the length in the long side direction of the rectangular sputtering surface 3 and the length in the short side direction thereof may be the same or different from each other.

When the target material 2 is formed in a plate shape, including the rectangular sputter surface 3, the backing plate 6 is also formed in a plate shape, including a rectangular upper surface, like the target material 2. At this time, the length of each of the short and long sides of the backing plate 6 is not particularly limited. The short and long sides of the backing plate 6 may be longer than the short and long sides of the target material 2, respectively. Alternatively, the length of each of the short and long sides of the backing plate 6 may be the same as the length of the corresponding one of the short and long sides of the target material 2, as is the case with the respective short sides of the target material 2 and the backing plate 6 shown in FIG. 1. Alternatively, the length of each of the short and long sides of the backing plate 6 may be slightly shorter than the length of the corresponding one of the short and long sides of the target material 2.

It is noted that the sputtering target 1 may be formed in a disk shape, including a circular sputtering surface 3. At this time, the target material 2 is also formed in a disk shape. When the target material 2 is formed in a disk shape, the planar shape and size of the target material 2 are not particularly limited, and thus the target material 2 having an arbitrary shape and size suitable for various applications can be used. When the target material 2 is formed in the disk shape, the backing plate 6 can be formed in a disk shape, including a circular upper surface that has a diameter equal to, larger, or slightly smaller than the upper surface of the target material 2.

In other embodiments, the sputtering target has a cylindrical shape. The cylindrical sputtering target includes a cylindrical target material and a cylindrical backing tube which is inserted into the target material. Alternatively, the sputtering target includes a cylindrical target material and flanges, cap materials, or adapter materials that are attached to both ends of the target material. In the case of a cylindrical target, the outer peripheral portion of the cylindrical target is a sputtering surface.

In another embodiment, a sputtering target is of an integrated type in which a portion corresponding to the backing plate and a portion corresponding to the target material are integrally formed from the same material. Since in the integrated sputtering target, the backing plate and the target material are integrally formed from the same material, a bonding step does not need to be performed, thus making it possible to simplify a manufacturing process of the sputtering target.

A material constituting the target material 2 is not particularly limited, and examples of this material suitable for use include Al, Cu, Cr, Fe, Ta, Ti, Zr, W, Mo, Nb, Ag, Co, Ru, Pt, Pd, Ni, and alloys containing these metals. In particular, aluminum (pure Al having a purity of 99.99% (4N) or more, and preferably 99.999% (5N) or more), an aluminum alloy (containing Si, Cu, Nd, Mg, Fe, Ti, Mo, Ta, Nb, W, Ni, Co, and the like as an additive element, and preferably containing Si or Cu as an additive element, with the Al purity of a base material excluding the additive element(s) being 99.99% or more, and preferably 99.999% or more), or copper (having a purity of 99.99% (4N) or more) can be preferably used as the material for forming the target material 2.

Metal that has a higher hardness than the target material 2 is preferably used in the backing plate 6. For example, Cu, Cr, Al, Ti, W, Mo, Ta, Nb, Fe, Co, Ni, alloys containing these metals, and the like can be used in the backing plate 6. In particular, copper (oxygen-free copper), a chromium-copper alloy, an aluminum alloy, or the like can be preferably used as a material for forming the backing plate 6.

In the case of metal that has a low melting point, such as pure Al or an Al alloy, the occurrence of abnormal discharge tends to cause a phenomenon called "splash" in which metal components molten from the target surface are ejected out, and thereby their particles having a size of several μm adhere to the substrate. However, according to the present invention, abnormal discharge and hard arc can be efficiently reduced even when metal having a low melting point, such as pure Al or an Al alloy, is used in the target material.

During the sputtering, an inert gas ionized by sputtering collides with the sputtering surface 3 of the target material 2. Target atoms contained in the target material 2 are sputtered and ejected from the sputtering surface 3 with which the ionized inert gas collides. The sputtered atoms are deposited on a substrate facing the sputtering surface 3 to thereby form a thin film on this substrate. To improve the deposition rate of the thin film, a high voltage normally needs to be applied to the target. However, in the present invention, by setting the lightness L of the sputtering surface 3 to more than 27 and 51 or less, the occurrence of abnormal discharge that would be caused by application of a high voltage, especially, hard arc can be reduced, thereby improving the product yield of sputtering targets. The parameter that should be controlled in manufacture of the sputtering target of the present invention is the lightness L only, thus facilitating the manufacture of the sputtering target and inspection of non-defective products thereof.

A specular reflectance of the sputtering surface of the sputtering target in the present invention using light at a wavelength of 500 nm is preferably 3.0% or less. Since the specular reflectance of the sputtering surface at a wavelength of 500 nm is set at 3.0% or less, a finishing process can be performed by polishing in the manufacturing process of the sputtering target, so that the sputtering target can be manufactured easily. Since the specular reflectance of the sputtering surface at a wavelength of 500 nm is set at 3.0% or less, bumps that would trigger sputtering can be approximately left, so that the sputtering can be stably performed when a high voltage is applied thereto or in an initial stage of the sputtering.

The specular reflectance of the sputtering surface of the sputtering target in the present invention using light at a wavelength of 1,000 nm is preferably 5.0% or less. Since the specular reflectance of the sputtering surface at a wavelength of 1,000 nm is 5.0% or less, a finishing process can be performed by polishing in the manufacturing process of the sputtering target, so that the sputtering target can be manufactured easily. Since the specular reflectance of the sputtering surface at a wavelength of 1,000 nm is 5.0% or less, bumps that would trigger sputtering can be approximately left, so that the sputtering can be stably performed when a high voltage is applied thereto or in the initial stage of the sputtering.

The arithmetic average roughness Ra of the sputtering surface of the sputtering target in the present invention is more than 0 μm and 2.0 μm or less, preferably 0.05 μm or more and 1.0 μm or less, more preferably 0.08 μm or more and 0.5 μm or less, and still more preferably 0.1 μm or more and 0.4 μm or less. When the arithmetic average roughness Ra of the sputtering surface falls within this range, the risk of occurrence of abnormal discharge caused by the application of a high voltage, especially, hard arc can be further reduced, and the sputtering can be stably performed in the initial stage of the sputtering. The above-mentioned arithmetic average roughness Ra can be measured by a method specified by JIS B0601(2001).

The maximum height Rz of the sputtering surface of the sputtering target in the present invention is more than 0 μm and 10.0 μm or less, preferably 0.25 μm or more and 8.0 μm or less, more preferably 0.5 μm or more and 5.0 μm or less, and still more preferably 1.0 μm or more and 3.0 μm or less. When the maximum height Rz of the sputtering surface falls within this range, the risk of occurrence of abnormal discharge caused by the application of a high voltage, especially, hard arc can be further reduced, and the sputtering can be stably performed in the initial stage of the sputtering. The above-mentioned maximum height Rz can be measured by a method specified by JIS B0601(2001).

Next, a method of manufacturing a planar sputtering target 1 shown in FIG. 1 will be described in detail. First, as shown in FIG. 2A, the target material 2 and the backing plate 6 for fixing the target material 2 are prepared. The target material 2 can use a plate-shaped metal material that is obtained by forming a metal mass, which has been produced by a melt casting method, a spray forming method, a powder metallurgy method, or the like, into a plate shape through a rolling method, a forging method, an extrusion method, or the like. In the target material 2, its surface serving as the sputtering surface is preferably flat and thus preferably subjected to machining with a milling cutter, a lathe, or the like, or grinding with a grinding machine.

Then, the target material 2 is fixed onto the backing plate 6. Specifically, bonding is performed to join the target material 2 and the backing plate 6. The bonding temperature may vary depending on a bonding method, and the type of materials constituting the target material 2 and the backing plate 6 to be used. However, for example, in the case of bonding (solder bonding) the target material 2 made of pure Al (purity: 99.999%) and the backing plate 6 made of oxygen-free copper (purity: 99.99%) with a solder material made of indium, tin, or an alloy containing thereof, the bonding is preferably performed at a temperature of 150° C. or higher and 300° C. or lower. The bonding method can also employ a diffusion bonding method using hot pressing or hot isostatic pressing. When the target material 2 has a disk shape, a support member mainly composed of a ring portion for arranging the target material 2 may be used. The support member preferably has a flange portion for enabling fixing to a sputtering device. The target material 2 can be attached to the ring-shaped support member by Tungsten Inert Gas (TIG) welding or Electron Beam (EB) welding.

The target material 2 and the backing plate 6 can also be integrally formed from the same material. The integrated spattering target is obtained by forming a metal mass, which has been produced by a melt casting method, a spray forming method, a powder metallurgy method, or the like, into a plate shape through a rolling method, a forging method, an extrusion method, or the like, and then forming the plate-shaped metal by machining into such a shape that includes a part corresponding to the backing plate and a part corresponding to the target material. The surface serving as a sputtering surface of the part corresponding to the target material of the integrated sputtering target is preferably flat and thus preferably subjected to machining with a milling cutter, a lathe, or the like, or grinding with a grinding machine. The integrated sputtering target does not need the above-mentioned bonding step.

Then, as shown in FIG. 2B, the polishing is performed on the sputtering surface 3 of the target material 2. This polishing may be performed using a plurality of abrasives having different grit numbers in ascending order of grit number from a small grit number to a large grit number. Specifically, in the case of polishing in two stages, in the first stage of polishing, the abrasive 4 is moved along the long side direction (direction indicated by the arrow A) of the target material 2, while polishing the target material 2. In the second stage of polishing, the polishing is performed in the same way as in the first stage using an abrasive having a larger grit number than a grit number of the abrasive 4 in the first stage. In the case of polishing in three or more stages, the polishing is performed using abrasives such that a grit number of an abrasive in the subsequent stage is larger than a grit number of an abrasive in the previous stage. When polishing the target material along its long side direction, the abrasive 4 may be moved up and down, or left and right, or may be rotated. The polishing direction is not limited to the long side direction, and the polishing may be performed in other directions.

The abrasive used in the polishing is not particularly limited and, for example, an abrasive that includes abrasive grains applied to paper or a fiber base material can be used. However, particularly, an abrasive that includes a nonwoven fabric of synthetic fiber, such as nylon, impregnated with abrasive grains is preferably used. Examples of the abrasive include Scotch-Brite (trade name, manufactured by 3M Japan Limited) and Kenmaron (trade name, manufactured by Sankyo-Rikagaku Co., Ltd.). By using an abrasive that includes an elastic base material in which a nonwoven fabric or the like has a high porosity, scratches can be prevented from occurring due to abrasive grains detached from the abrasive, and the abrasive can be easily applied to a polished surface and can also easily reduce variations in polishing. Abrasive grains are not particularly limited. Any abrasive grain may be selected as long as it has sufficient polishing capability and hardness with respect to the quality of the target material. When the target material is Al or Cu, for example, SiC or alumina may be used as material of the abrasive. It is noted that in the present invention, the correlation between the grain size distribution of abrasive grains of abrasives and the grit numbers (grain sizes) of the abrasivesthereof is in conformity with JIS R 6001. The polishing is preferably performed while removing polishing sludge and detached abrasive grains by suction, air exhaust, and air blowing. Thus, the target material 2 can be polished without leaving any polishing sludge and detached abrasive grains on the polished surface, thereby making it possible to prevent the occurrence of deep scratches thereon and the roughening of the polished surface, which can further improve the uniformity of the lightness L of the sputtering surface 3. The removal of the abrasive sludge and the detached abrasive grains by suction can be carried out in a dust collector or near the dust collector, or by use of a polishing machine equipped with a dust collection mechanism.

It is noted that the polishing can be performed manually or by using a polishing machine equipped with the abrasive. As the polishing machine, an orbital sander is preferably used, but is not limited thereto. Any polishing machine, such as a mini-angle sander, a disk-grinder, or a belt sander, can also be used.

Then, the polished surface obtained after the polishing is cleaned. The cleaning of the surface is preferably performed by air blowing and wiping with alcohol. A solvent used for wiping is not particularly limited, and examples of the solvent suitable for use include organic solvents, such as ethanol, methanol, isopropyl alcohol, acetone, hexane, toluene, xylene, methylene chloride, and ethyl acetate; a commercially available cleaning agent; and the like. In this way, the sputtering target 1 shown in FIG. 1 is manufactured.

It is noted that the manufacturing method of the present invention may include any other step, in addition to the above-mentioned steps. For example, the manufacturing method may include, between the bonding step and the polishing step, an ultrasonic flaw detection (UT detection) step, a polishing step of the backing plate 6, or the like.

According to the above-mentioned manufacturing method, as the grit number of the abrasive used to polish the sputtering surface 3 of the target material 2 increases, the lightness of the surface of the target material 2 decreases. Consequently, the sputtering target 1 can be obtained which has little variations in lightness over the entire sputtering surface 3 and is less likely to cause abnormal discharge.

As mentioned above, the sputtering target of the present invention can be manufactured very simply, as compared with the reference 1 in which a sputtering target is manufactured so that the arithmetic average roughness Ra, the maximum height Rz, and the distance L between the points with the peak heights are adjusted within predetermined respective ranges, and then these parameters need to be measured after a finishing process.

The evaluation of the sputtering target 1 is performed by measuring the lightnesses L and the specular reflectances at a plurality of arbitrary points of the sputtering surface 3 using a color difference meter and a spectrophotometer, respectively, and calculating the average value and standard deviation of the plurality of lightnesses L and specular reflectances which have been measured. The standard deviation as used in the present specification refers to an unbiased standard deviation $\sigma_{n-1}$, which is a square root of unbiased variance $u^2$. The standard deviation is represented by the following equation.

$$\sigma_{n-1} = \sqrt{\frac{1}{n-1} \sum_{i=1}^{n} (x_i - \bar{x})^2} \quad (1)$$

While the method for manufacturing a planer sputtering target shown in FIG. 1 has been described above, a cylindrical sputtering target that is less likely to cause abnormal discharge in sputtering can also be manufactured in the same manner. A method for manufacturing a cylindrical sputtering target according to an embodiment of the present invention will be described below.

A cylindrical target material made of metal is prepared. The cylindrical target material can be formed by an extrusion method or the like from a metal mass, which has been produced by a melt casting method, a spray forming method, a powder metallurgy method, or the like. In the target material, its outer peripheral surface serving as the sputtering surface preferably has no distortion. Machining with a lathe or grinding with a grinding machine is preferably performed. In the case of a sputtering target using a backing tube, the target material is bonded to the backing tube. The bonding temperature may vary depending on a bonding method, a target material used, and the type of a material constituting the backing tube. For example, when the target material made of high-purity Al (having a purity of 99.99 to 99.999%) and the backing tube made of SUS304 are bonded (solder-bonded) together with a joint material made of indium, tin, or an alloy containing thereof, the bonding is preferably performed at a temperature of 150° C. or higher and 300° C. or lower.

In the case of a sputtering target to which a flange or cap material is attached, the cap or flange is attached to each of both ends of the target material by Tungsten Inert Gas welding (TIG welding) or Electron Beam welding (EB welding).

The polishing step, the cleaning step of the surface after the polishing, and other arbitrary steps can be performed in the same manner as in the case of the target having a shape of flat plate. In the polishing step, an abrasive that includes abrasive grains applied to a paper or a fiber base material is used, and the polishing can be performed manually or by using a polishing machine in the same manner as the planar target. This polishing may be performed in a multi-stage using a plurality of abrasives having different grit numbers in ascending order of grit number from a small grit number to a large grit number. Specifically, the abrasive is moved along the axial direction of the cylindrical target material 2, while polishing the target material. At this time, the abrasive may be moved while rotating the target material, or alternatively, the abrasive may be moved while fixing the target material. During the polishing, the axial direction of the target material may be horizontal or vertical relative to the ground surface. Alternatively, the axial direction of the target material may be inclined with an angle at which the polishing is easily performed. In the second stage of polishing, the polishing is performed in the same way as in the first stage by using the abrasive having a larger grit number than the grit number of the abrasive in the first stage. In the case of polishing in three or more stages, the polishing is performed using abrasives such that the grit number of the abrasive in the subsequent stage is larger than the grit number of the abrasive in the previous stage. When polishing the target material along its axial direction, the abrasive may be moved up and down, or left and right, or may be rotated. The polishing direction is not limited to the axial direction, and thus the polishing may be performed in other directions.

Like the planar target, the evaluation of the surface roughness of the cylindrical sputtering target, manufactured in the above-mentioned steps, is performed by measuring the lightnesses L and the specular reflectances at a plurality of arbitrary points of the sputtering surface using a color difference meter and a spectrophotometer, respectively, and calculating the average value and standard deviation of a plurality of lightnesses L and specular reflectances which have been measured. As the grit number of the abrasive used to polish the sputtering surface of the target material increases, the lightness of the surface of the target material 2 decreases. Consequently, the sputtering target 1 can be obtained which has little variations in the lightness over the entire sputtering surface 3 and is less likely to cause abnormal discharge (especially hard arc).

Examples 1 to 3 and Comparative Examples 1 to 3

The target material 2 having a circular sputtering surface of 2 inches in diameter and 3 mm in thickness was solder-bonded to the backing plate 6 composed of oxygen-free copper (having a purity of 99.99%) at 200° C. to form the sputtering target 1. The target material 2 formed of aluminum (purity: 99.999%) having a Vickers hardness of 16 was used, with its sputtering surface subjected to lathing.

Then, the multi-stage polishing was performed as the finishing process of the sputtering surface 3 of the target material 2, using a plurality of abrasives having different grit numbers in ascending order of grit number from a small grit number to a large grit number. Specifically, the polishing was performed on the sputtering surface 3 of the target material 2 using an orbital sanders (SV12SG (trade name) manufactured by Hitachi Koki Co., Ltd.) which was equipped with an appropriate one of abrasives Kenmaron (trade name, manufactured by Sankyo-Rikagaku Co., Ltd.) having various grit numbers (grain sizes), each abrasive having a size of 110 mm×180 mm, while moving and pressing the swinging abrasive against the sputtering surface. At this time, the polishing was performed in a dust collector while removing polishing sludge. After the polishing, the sputtering surface 3 of the target material 2 was air-blown and wiped with ethanol to thereby complete the finishing process. Table 1 below shows the grit number of each of the abrasives used in the multi-stage polishing and the time required for the polishing in each stage in Examples 1 to 3 and Comparative Examples 1 to 3. For example, in Example 1, polishing was performed for 20 seconds with an abrasive having a grit number of #400, then polishing was performed for 20 seconds with an abrasive having a grit number of #800, and finally polishing was performed for 20 seconds with an abrasive having a grit number of #1200. In Comparative Example 2, a sputtering surface was formed by using a lathe, instead of polishing, and then subjected to a finishing process in the same manner as in the other examples and comparative examples.

TABLE 1

| | Polishing conditions (Grit number of abrasive) | | | | |
|---|---|---|---|---|---|
| Sample | #400 | #800 | #1200 | #1500 | #3000 |
| Example 1 | 20 | 20 | 20 | — | — |
| Example 2 | 20 | 40 | 30 | — | — |
| Example 3 | 20 | 40 | — | — | — |
| Comparative Example 1 | 20 | 30 | — | — | — |
| Comparative Example 2 | — | — | — | — | — |
| Comparative Example 3 | 20 | 40 | 30 | 120 | 90 |

Next, the sputtering surfaces of the targets in Examples 1 to 3 and Comparative Examples 1 to 3, which had been subjected to the finishing process, were evaluated by the following procedure.

First, a color difference of the sputtering surface 3 was measured with a color difference meter (Z-300A (trade name), manufactured by NIPPON DENSHOKU INDUSTRIES Co., Ltd.) by a reflection method under the following conditions to thereby determine a lightness L. The measurement was performed at three arbitrary measurement points on the sputtering surface 3, within a circle having a diameter of about 10 mm with each measurement point as a center of the circle. Furthermore, the average value and standard deviation of three lightnesses L corresponding to the three measurement points were calculated.

<Analysis Conditions>
Measured diameter: 10 mm
Spectral sensitivity: 2° field of view

TABLE 2

| Sample | Lightness L Average value | Lightness L Standard deviation | Reflectance (1,000 nm) (%) Average value | Reflectance (1,000 nm) (%) Standard deviation | Reflectance (500 nm) (%) Average value | Reflectance (500 nm) (%) Standard deviation | Ra (μm) Average value | Ra (μm) Standard deviation | Rz (μm) Average value | Rz (μm) Standard deviation |
|---|---|---|---|---|---|---|---|---|---|---|
| Example 1 | 38.0 | 1.0 | 3.1 | 0.0 | 1.0 | 0.0 | 0.31 | 0.03 | 2.01 | 0.15 |
| Example 2 | 36.0 | 1.2 | 3.1 | 0.1 | 1.0 | 0.1 | 0.37 | 0.02 | 2.64 | 0.25 |
| Example 3 | 45.5 | 1.8 | 3.6 | 0.8 | 2.0 | 0.3 | 0.36 | 0.03 | 2.74 | 0.13 |
| Comparative Example 1 | 52.4 | 1.7 | 2.4 | 0.0 | 1.3 | 0.1 | 0.38 | 0.03 | 2.83 | 0.39 |
| Comparative Example 2 | 53.0 | 0.6 | 15.6 | 2.3 | 12.9 | 1.1 | 1.43 | 0.02 | 7.57 | 031 |
| Comparative Example 3 | 26.9 | 0.1 | 11.3 | 1.7 | 1.7 | 0.2 | 0.39 | 0.06 | 2.36 | 0.39 |

Light source: C light source
Color difference formula: $L=10(Y)^{1/2}$

Although the evaluation of the sputtering surfaces 3 in Examples 1 to 3 and Comparative Examples 1 to 3 was performed using a stationary color difference meter, a portable color difference meter or reflectometer can also be used to measure the lightness L of the sputtering surface 3. By using these, the color difference and reflectance of the sputtering surface after the polishing can be measured in situ without moving the sputtering target to the stationary color difference meter. The measurement can be performed on even a large-sized target material that has, for example, a length in a long side direction of 1,000 mm to 3,500 mm and a length in a short side direction of 180 mm to 1,900 mm.

Then, the specular reflectance of the target material was measured using a spectrophotometer (Model U-4100 (trade name), manufactured by Hitachi High-Technologies Corporation). Specifically, each sample was irradiated with incident light at an incident angle of 5 degrees using a 5 degree specular reflectance accessory for a U-4100 type spectrophotometer, and then the reflectance of the incident light reflected at a reflection angle of 5 degrees was measured. The measurement was performed at three arbitrary measurement points on the sputtering surface 3, within a circle having a diameter of about 20 mm with each measurement point as a center of the circle. Furthermore, the average value and standard deviation of three reflectances corresponding to the three measurement points were calculated.

The arithmetic average roughness Ra and the maximum height Rz of the sputtering surface of the target material were measured based on JIS B0601 (2001) by using a portable surface roughness measurement tester Surftest SJ-301 (trade name) manufactured by Mitsutoyo Corporation. The measurement was performed at three arbitrary measurement points on the sputtering surface 3. Furthermore, the average value and standard deviation of three measured values corresponding to the three measurement points were calculated.

Table 2 shows the average values and standard deviations calculated from the lightnesses L, the reflectances, the arithmetic average roughnesses Ra, and the maximum heights Rz measured on the sputtering surfaces of the targets in Examples 1 to 3 and Comparative Examples 1 to 3.

From Table 1, it has been found that the specular reflectances of the sputtering surface 3 at wavelengths of 500 nm and 1,000 nm were 3.0% or less and 5.0% or less, respectively, when the finishing process was performed by multi-stage polishing, using a plurality of abrasives having different grit numbers in ascending order of grit number from a small grit number to a large grit number.

Subsequently, each of the targets in Example 1 and Comparative Example 1 was attached to a sputtering device (E-200S (tradename), manufactured by CANON ANELVA CORPORATION) to perform sputtering, and the number of hard arcs and the number of micro arcs were measured by an arc monitor (p ArcMonitor (MAM Genesis) (trade name), manufactured by Landmark Technologies Ltd.). Regarding the sputtering, the sputtering power was 200 W, the argon gas pressure was 0.2 Pa, and the sputtering time was 3 minutes. In the sputtering, the number of times that the period during which the voltage was below 500 V was 5 μs or more was measured as a hard arc count, and the number of times that the period during which the voltage was below 500 V was less than 5 μs was measured as a micro arc count. In Examples 2 and 3 and Comparative Examples 2 and 3, the target was sputtered on the same conditions as those of Example 1 and Comparative Example 1, except for an argon gas pressure of 1.0 Pa, and during the sputtering, the hard arc count and the micro arc count were measured. It is noted that another target which had been fabricated on the same polishing conditions as the target used to evaluate its sputtering surface in each of Examples 1 to 3 and Comparative Examples 1 to 3 was utilized for the sputtering.

Table 3 shows the hard arc count and the micro arc count measured in the above-mentioned sputtering. It is noted that Table 3 also shows the lightness L mentioned in Table 2 and measured on the sputtering surface of the target in each of Examples 1 to 3 and Comparative Examples 1 to 3.

TABLE 3

| Sample | Lightness L Average value | Lightness L Standard deviation | Micro arc count | Hard arc count |
|---|---|---|---|---|
| Example 1 | 38.0 | 1.0 | 0 | 0 |
| Example 2 | 36.0 | 1.2 | 0 | 0 |
| Example 3 | 45.5 | 1.8 | 0 | 0 |

TABLE 3-continued

| | Lightness L | | | |
|---|---|---|---|---|
| Sample | Average value | Standard deviation | Micro arc count | Hard arc count |
| Comparative Example 1 | 52.4 | 1.7 | 0 | 1 |
| Comparative Example 2 | 53.0 | 0.6 | 0 | 1 |
| Comparative Example 3 | 26.9 | 0.1 | 2 | 5 |

As shown in Table 1, the sputtering target that had its lightness L ranging from more than 27 to 51 or less did not cause any hard arc or micro arc.

Although in the above-mentioned examples, the planar target material has been described, the same effects can be obtained even from the cylindrical target material, as long as the lightness L of the sputtering surface ranges from more than 27 to 51 or less.

DESCRIPTION OF REFERENCE NUMERALS

1 Sputtering target
2 Target material
3 Sputtering surface
4 Abrasive
6 Backing plate

The invention claimed is:

1. A sputtering target consisting of metal or an alloy, and having a sputtering surface in which a lightness L in a Lab color system is more than 27 and 51 or less.

2. The sputtering target according to claim 1, wherein a specular reflectance of the sputtering surface at a wavelength of 500 nm is 3.0% or less.

3. The sputtering target according to claim 1, wherein a specular reflectance of the sputtering surface at a wavelength of 1,000 nm is 5.0% or less.

4. The sputtering target according to claim 1, wherein the sputtering surface is a polished surface.

5. The sputtering target according to claim 1, which is made of Al or an Al alloy.

\* \* \* \* \*